US005258714A

United States Patent [19]

Dunlap et al.

[11] Patent Number: 5,258,714

[45] Date of Patent: Nov. 2, 1993

[54] VIRTUAL CURRENT SENSING SYSTEM

[75] Inventors: Frank M. Dunlap, San Francisco; Vincent S. Tso, Oakland, both of Calif.

[73] Assignee: Sierra Semiconductor Corporation, San Jose, Calif.

[21] Appl. No.: 38,187

[22] Filed: Mar. 26, 1993

Related U.S. Application Data

[63] Continuation of Ser. No. 775,584, Oct. 15, 1991, abandoned.

[51] Int. Cl.[5] ............................................ H03F 1/02

[52] U.S. Cl. ........................................ 330/2; 330/255

[58] Field of Search .................. 330/2, 255, 256, 264, 330/265, 271, 275; 307/530, 355, 359, 296.1, 303, 494; 323/268, 337

[56] References Cited

U.S. PATENT DOCUMENTS

| | | | |
|---|---|---|---|
| 4,261,044 | 4/1981 | Closson et al. | 330/256 |
| 4,318,187 | 3/1982 | Seitchik et al. | 330/256 |
| 4,400,796 | 8/1983 | Closson et al. | 330/256 |
| 4,833,418 | 5/1989 | Quintus et al. | 330/259 |
| 5,006,817 | 4/1991 | Babanezhad | 330/255 |

*Primary Examiner*—Steven Mottola
*Assistant Examiner*—Tan Dinh
*Attorney, Agent, or Firm*—Burns, Doane, Swecker & Mathis

[57] ABSTRACT

A virtual sensing system includes a sensing network that is external to a standard cell for sensing a reference current in the standard cell and for generating a scaled current without breaking the reference current path and without inserting any sensing device in series with the reference current. The reference current can be used, for example, for duplication and/or scaling.

7 Claims, 2 Drawing Sheets

VIRTUAL CURRENT SENSING SYSTEM

This application is a continuation of application Ser. No. 07/775,584, filed Oct. 15, 1991, now abandoned.

BACKGROUND OF THE INVENTION

1. Field of the Invention

The present invention generally relates to systems for sensing electrical currents in integrated circuits that are assembled from standard cells.

2. State of the Art

In the design of modern mixed signal integrated circuits, including application-specific integrated circuits, complex analog functions often can be implemented by assembling appropriate "standard cells" such as operational amplifiers. Because standard cells provide well-defined internal and external characteristics, they can be used for rapidly designing and fabricating integrated circuits.

When designing integrated circuits that include standard cells, it is often desirable to determine the values of current and voltage parameters that are internal to the cells. Although such measurements can be made by circuits that are designed into a standard cell, the mere presence of designed-in sensing components renders a standard cell "non-standard." Also, designed-in sensing components can adversely affect the output characteristics of a standard cell, especially when the cell is used in low voltage applications.

SUMMARY OF THE PRESENT INVENTION

Generally speaking, the present invention provides a sensing system—referred to herein as a virtual sensing system—that includes a sensing network external to a standard cell. In operation, the virtual sensing system senses a reference current in a standard cell and generates a scaled current without breaking the reference current path and without introducing an additional voltage drop into the primary output of the standard cell. The reference current can be used, for example, for duplication and/or scaling purposes.

BRIEF DESCRIPTION OF THE DRAWINGS

The present invention can be further understood with reference to the following description in conjunction with the appended drawings, wherein like elements are provided with the same reference numerals. In the drawings.

DETAILED DESCRIPTION OF THE PREFERRED EMBODIMENTS OF THE PRESENT INVENTION

Figure 1:
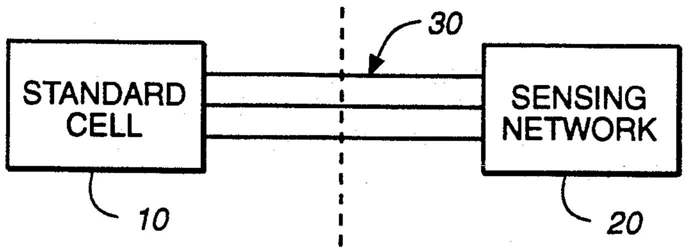
FIG. 1 is a functional block diagram that generally shows a standard cell and an external sensing network.
Figure 2:
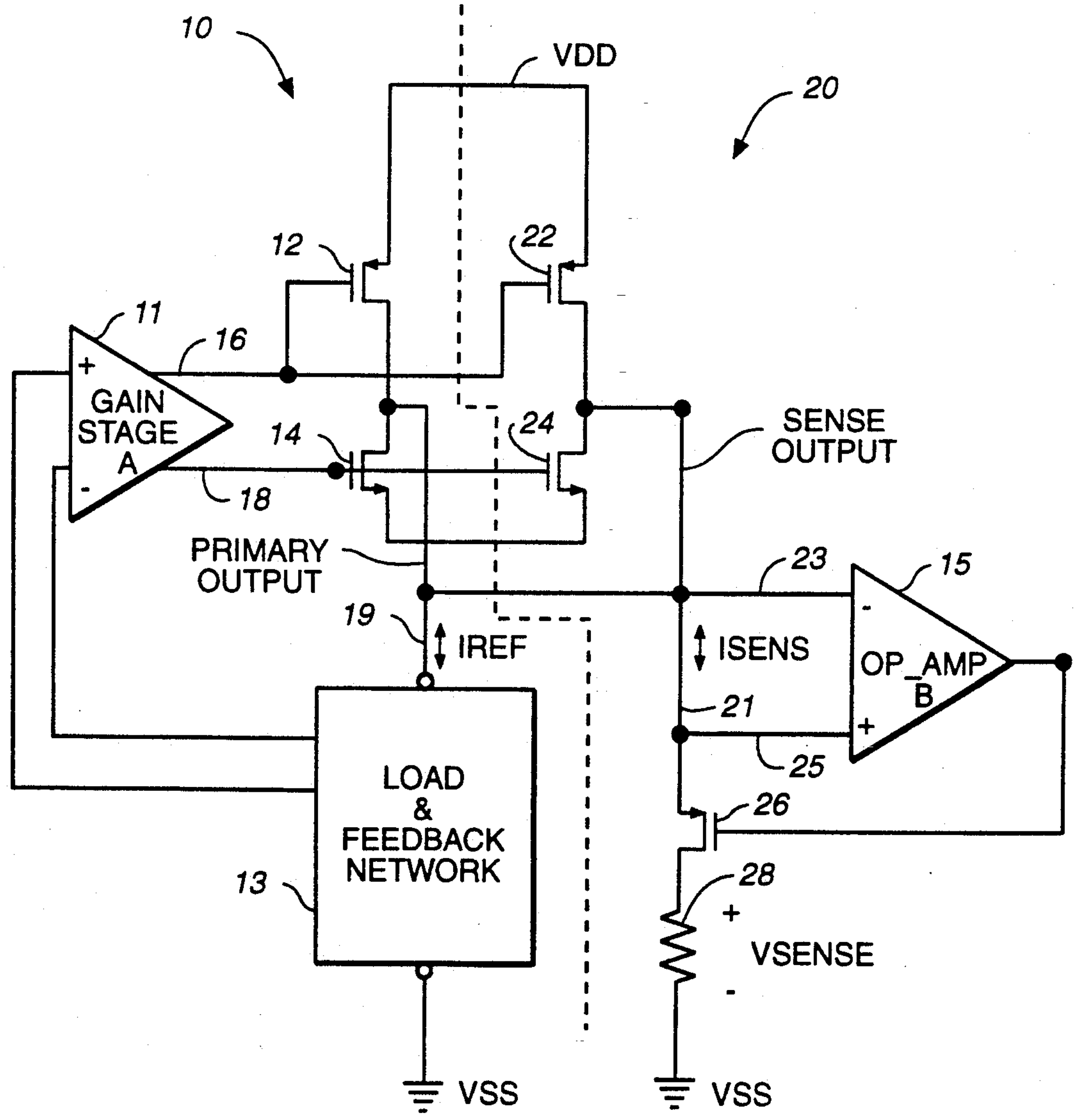
FIG. 2 shows particular circuits according to the present invention for use in the system of FIG. 1.

FIGS. 1 and 2 show a standard cell 10 which is connected to a sensing network 20 by leads 30. In the drawing, the dotted line across the leads 30 indicates a boundary between components that are internal to the standard cell 10 and components that are within the sensing network 20. The sensing network 20—referred to herein as a virtual sensing system—operates to measure a standard cell parameter, such as a reference current, without disrupting the circuitry in the standard cell.

The particular standard cell 10 shown in FIG. 2 is a portion of a precision bandgap reference circuit having a two-stage output amplifier. The first stage of the amplifier is a gain stage driver 11, such as an operational amplifier, and the second stage is a pair of MOS-FETs 12 and 14, respectively, that comprise a push-pull amplifier network. As shown in the drawing, the gain stage driver 11 provides signals on lines 16 and 18 that connect to the gates of the MOS-FETs 12 and 14, respectively. The source bias voltages for the PMOS and NMOS devices 12 and 14 are provided by constant voltage sources $V_{DD}$ and $V_{SS}$, respectively.

Further with regard to FIG. 2, the primary output current from the reference circuit 10 is designated as current $I_{REF}$ on a conductor 19. It is the current $I_{REF}$ that is applied to a load and feedback network 13. In practice, the magnitude of the current $I_{REF}$ is linearly related to the absolute temperature of components within the reference circuit 10 and, therefore, circuit of FIG. 2 can be used for temperature compensation.

As further shown in FIG. 2, the signals on lines 16 and 18 are applied to the gates of a pair of MOS-FETs 22 and 24 that are located in the virtual sensing system 20. The two MOS-FETs 22 and 24 are connected in a push-pull amplifier configuration that replicates the output stage of the reference circuit 10. Thus, the two MOS-FETs 22 and 24 replicate the second stage of the reference circuit. (The source bias voltages for the MOS-FETs are again provided by constant voltage sources $V_{DD}$ and $V_{SS}$.) In practice, the MOS-FETs 22 and 24 are selected such that their characteristics substantially match those of the MOS-FETs 12 and 14. A conductor 21 is connected between the MOS-FETs 22 and 24 to carry a current $I_{SENS}$.

As still further shown in FIG. 2, a differential voltage operational amplifier 15 is connected to force the output voltage of the replicate circuit to be equal to the output voltage of the reference circuit 10. More particularly, a line 23 is connected from the $I_{REF}$ conductor to the inverting input of the operational amplifier 15, and a line 25 is connected from the $I_{SENS}$ conductor 21 to the non-inverting input of the operational amplifier 15. In practice, because the operational amplifier 15 has extremely high input impedance, the currents carried by conductors 23 and 25 to the inverting and non-inverting inputs, respectively, are negligibly small. The output of the operational amplifier 15 is connected to the gate of a MOS-FET 26. The drain of the MOS-FET 26 is connected to receive the current $I_{SENS}$. The source of the MOS-FET 26 is connected, via a resistor 28, to the constant voltage $V_{SS}$.

In operation in the virtual sensing system of FIG. 2, the magnitude of the drain current $I_{SENS}$ through MOS-FET 26 is determined by the feedback from the operational amplifier 15. Due to negative feedback of the operational amplifier 15, the drain current $I_{SENS}$ is adjusted such that the sensed output voltage is equal to the primary output voltage. Thus, the operating conditions of the primary output of the bandgap reference circuit are imposed upon the virtual sensing network with the result that the current and voltage conditions at the sense output equal the current and voltage at the primary output of the standard cell—and, this is true even though different loads are applied to the standard cell and the virtual sensing network. Moreover, the virtual sensing network operates without affecting the value of the measured parameters; that is, the measured values of the parameters do not depend upon whether the sensing network is present or absent.

At this juncture, it can be appreciated that the voltage $V_{SENSE}$ is a single-ended voltage referenced to ground (i.e., $V_{SS}$). Thus, the voltage $V_{SENSE}$ is more useful than the un-referenced, differential voltage that would be developed across a simple resistor in series before the load and feedback network.

Further in the system of FIG. 2, if the current ISENS is to flow toward the VSS supply (i.e., in the same direction as the current IREF, as indicated by the arrows), the MOS-FET 26 would be an NMOS-type transistor as shown. If the current directions are reversed, the MOS-FET 26 would be a PMOS-type transistor and resistor 28 would be connected to VDD.

Figure 3:
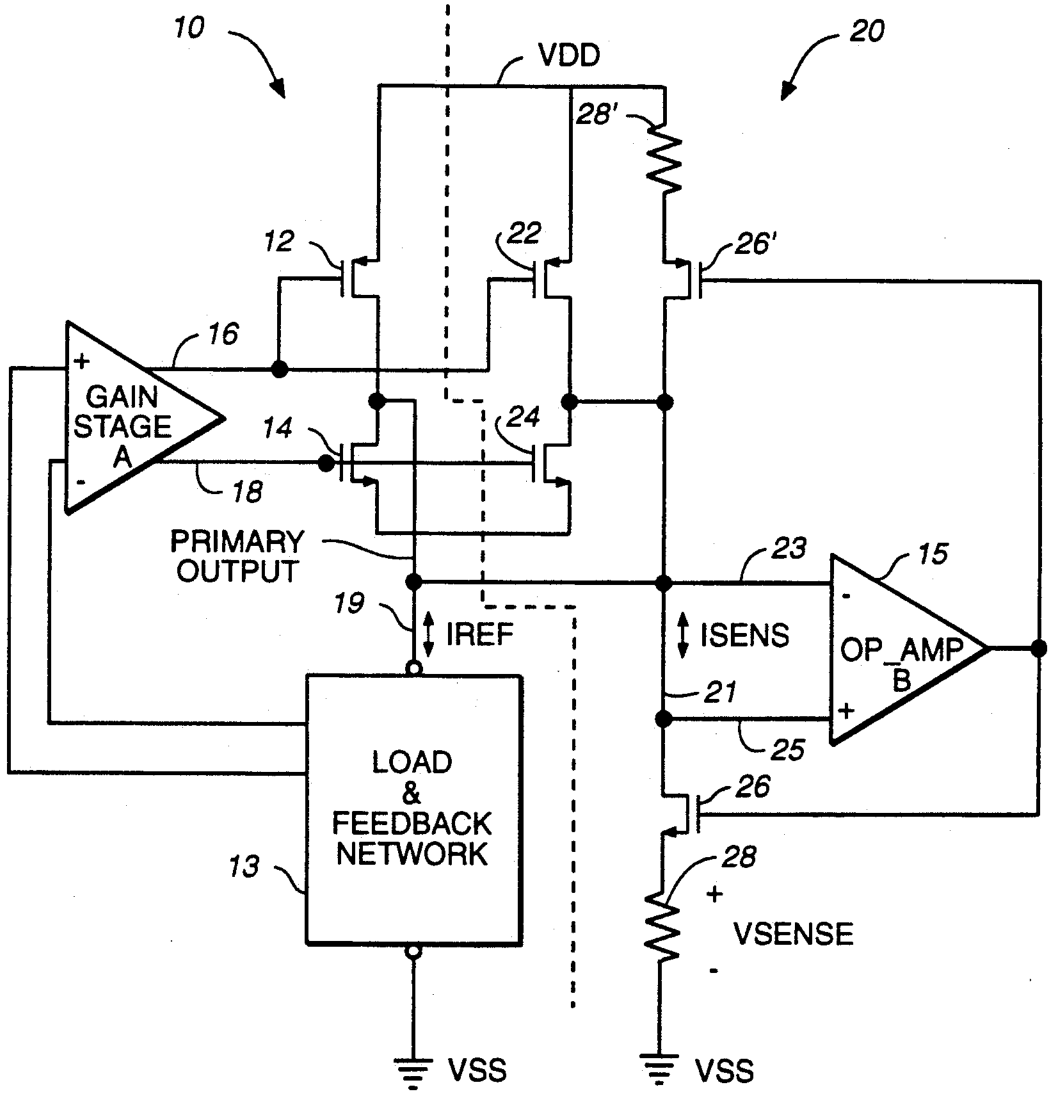
FIG. 3 shows other circuits according to the present invention for use in the system of FIG. 1.
Figure 2:
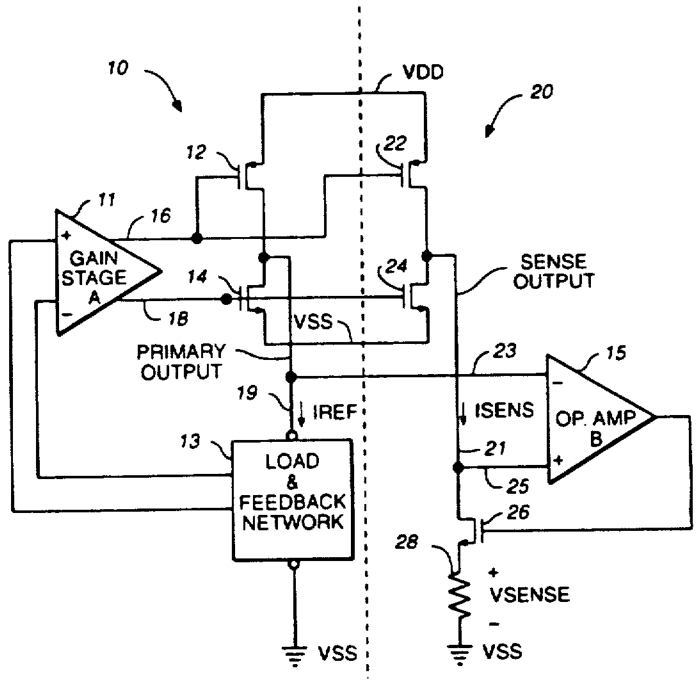
Figure 3:
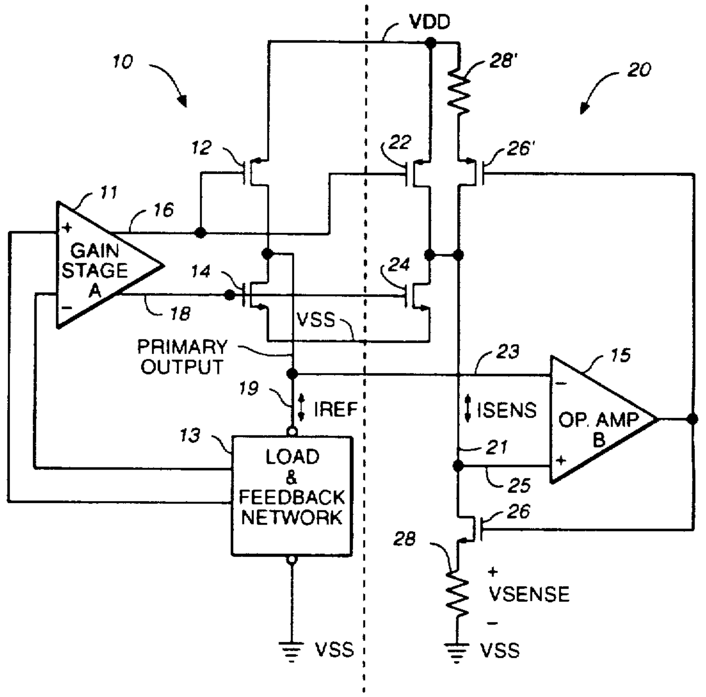

FIG. 3 illustrates the case where the currents IREF and ISENS are bidirectional. In this case, a combination of NMOS and PMOS transistors 26, 26' determines the feedback around the operational amplifier. It will be appreciated that FETs 26, 26' are selected to minimize current leaking past FET 26 when FET 26' is on or past FET 26' when FET 26 is on because those leakage currents become part of the current ISENS. An additional resistor 28' for translating current into voltage is also provided.

It can be appreciated that the above-described techniques can be applied to replicating almost any output stage and, therefore, the above-described sensing network may be added as desired to existing circuits. Normally, it is desired that the replicate stage and the sensed circuit output stage have operating conditions as nearly identical as possible for maximum sensing accuracy. In applications where the maximum accuracy is not necessary—such as where a standard cell output stage can be represented by a current source—the operational amplifier 15 might be eliminated.

The foregoing has described the principles, preferred embodiments and modes of operation of the present invention. However, the invention should not be construed as limited to the particular embodiments discussed. For example, although the preceding description has been provided in terms of MOS devices, the present invention may also be applied to circuits using other transistor types. FETs are advantageous for precision applications since they avoid errors due to the non-zero base currents of bipolar transistors. As another example, although the second stage of the standard cell is replicated exactly in the embodiments shown in FIGS. 2 and 3, a scale factor could be introduced for providing a current ISENS value that is the current IREF value multiplied by the scale factor.

Accordingly, the above-described embodiments should be regarded as illustrative rather than restrictive, and it should be appreciated that variations may be made in those embodiments by workers skilled in the art without departing from the scope of present invention as defined by the following claims.

What is claimed is:

1. A system for replicating a load-driving output current generated by an electrical circuit having a gain stage and an output stage, the output stage generating the load-driving output current in response to control signals from the gain stage, comprising:

duplicating means that are responsive to the control signals for duplicating the load-driving output current generated by the output stage; and equating means that are operatively connected to the duplicating means and the output stage for creating an output signal from the duplicating means that bears a fixed proportion to the load-driving output current from the output stage during different operating states of said electrical circuit without affecting the load-driving output current generated by the output stage.

2. The system of claim 1, wherein the duplicating means comprises transistors.

3. The system of claim 2, wherein the transistors comprise a pair of field-effect transistors connected in a push-pull amplifier configuration.

4. The system of claim 1, wherein the equating means comprises an operational amplifier connected for providing feedback.

5. The system of claim 1, further comprising means, connected to the duplicating means, for translating the output of the duplicating means into a voltage.

6. A method for replicating a load-driving output current generated by an electrical circuit having a gain stage and an output stage, the output stage generating the load-driving output current in response to a plurality of signals from the gain stage, comprising the steps of:

duplicating the output stage of the electrical circuit in a replicate stage;

communicating the control signals to the replicate stage; and equating an output from the replicate stage with the electrical circuit output, whereby a duplicate current is generated by the replicate stage during different operating states of said electrical circuit without affecting the load-driving output current generated by the load-driving output stage or the operation of the output stage.

7. The method of claim 6 wherein the equating step comprises feedback signals from an operational amplifier.

* * * * *

UNITED STATES PATENT AND TRADEMARK OFFICE

CERTIFICATE OF CORRECTION

PATENT NO. : 5,258,714
DATED : November 2, 1993
INVENTOR(S) : Frank M. Dunlap, Vincent S. Tso It is certified that error appears in the above-indentified patent and that said Letters Patent is hereby corrected as shown below:

IN THE DRAWINGS

In Figure 2, lines 21 and 23 are not electrically connected. The transistor 26 should appear as shown on the attached page.

In Figure 3, lines 21 and 23 are not electrically connected. See corrected Figure as shown on the attached page.

Signed and Sealed this

Twenty-sixth Day of July, 1994

Attest:

BRUCE LEHMAN

*Attesting Officer* *Commissioner of Patents and Trademarks*